(12) United States Patent
Noh et al.

(10) Patent No.: US 11,322,572 B2
(45) Date of Patent: May 3, 2022

(54) ORGANIC LIGHT EMITTING DISPLAY DEVICE INCLUDING VOLTAGE LINE CONNECTED TO CATHODE ELECTRODE

(71) Applicant: SAMSUNG DISPLAY CO., LTD., Yongin-si (KR)

(72) Inventors: Dae-Hyun Noh, Hwaseong-si (KR); Yong Sung Park, Seoul (KR); Won Jang Ki, Yongin-si (KR); Dong-Hyun Lee, Suwon-si (KR); Min Su Lee, Yongin-si (KR); Seung Bin Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 155 days.

(21) Appl. No.: 16/784,844

(22) Filed: Feb. 7, 2020

(65) Prior Publication Data
US 2020/0286976 A1   Sep. 10, 2020

(30) Foreign Application Priority Data

Mar. 7, 2019   (KR) .......................... 10-2019-0026393

(51) Int. Cl.
*H01L 27/32* (2006.01)
(52) U.S. Cl.
CPC ................................ *H01L 27/3276* (2013.01)
(58) Field of Classification Search
CPC .................................................. H01L 27/3276
See application file for complete search history.

(56) References Cited

U.S. PATENT DOCUMENTS

| | | | |
|---|---|---|---|
| 10,096,622 B2 | 10/2018 | Gupta et al. | |
| 2006/0113903 A1* | 6/2006 | Kim | H01L 27/3251 313/506 |
| 2013/0134401 A1* | 5/2013 | Murakami | H01L 51/5203 257/40 |
| 2016/0087021 A1* | 3/2016 | Sato | H01L 27/3262 257/43 |
| 2016/0365398 A1* | 12/2016 | Kim | H01L 27/3258 |
| 2017/0033312 A1* | 2/2017 | Kim | H01L 27/3276 |
| 2017/0185193 A1* | 6/2017 | Kim | H01L 27/124 |

(Continued)

FOREIGN PATENT DOCUMENTS

| | | |
|---|---|---|
| JP | 4663257 | 4/2011 |
| JP | 5017851 | 9/2012 |

(Continued)

*Primary Examiner* — Lex H Malsawma
(74) *Attorney, Agent, or Firm* — F. Chau & Associates, LLC

(57) ABSTRACT

An organic light emitting diode display is described which includes a substrate having a display area and a non-display area; a metal layer disposed on the non-display area of the substrate, an insulating layer, a voltage line disposed on the gate insulating layer and receiving a driving voltage, a second voltage line disposed on the gate insulating layer and receiving a low driving voltage, an organic insulating layer, and a cathode electrode disposed on the organic insulating layer. The second voltage line and the cathode electrode are electrically connected to each other through an opening formed in the organic insulating layer, and the first voltage line or the second voltage line is electrically connected to the metal layer through an opening formed in the gate insulating layer.

20 Claims, 13 Drawing Sheets

(56) References Cited

U.S. PATENT DOCUMENTS

| | | | | |
|---|---|---|---|---|
| 2017/0287995 A1* | 10/2017 | Kim | ................... | H01L 27/3276 |
| 2017/0323910 A1* | 11/2017 | Park | ................... | H01L 27/3265 |
| 2019/0189636 A1* | 6/2019 | Gang | ............... | G02F 1/133602 |
| 2019/0288046 A1* | 9/2019 | Park | ................... | H01L 51/5228 |
| 2019/0378889 A1* | 12/2019 | Choi | ................... | G09G 3/3266 |

FOREIGN PATENT DOCUMENTS

| | | |
|---|---|---|
| JP | 6220946 | 10/2017 |
| KR | 10-0784544 | 12/2007 |
| KR | 10-1589751 | 1/2016 |

\* cited by examiner

ORGANIC LIGHT EMITTING DISPLAY DEVICE INCLUDING VOLTAGE LINE CONNECTED TO CATHODE ELECTRODE

CROSS-REFERENCE TO RELATED APPLICATION

This application claims priority to and the benefit of Korean Patent Application No. 10-2019-0026393 filed in the Korean Intellectual Property Office on Mar. 7, 2019, the entire contents of which are incorporated by reference herein.

BACKGROUND

(a) Technical Field

The present disclosure relates to an organic light emitting diode (OLED), and particularly relates to a wire structure for applying a driving voltage and a low driving voltage to an OLED.

(b) Description of the Related Art

OLEDs may be used in the production of display devices. In an OLED display, a plurality of pixels may be arranged in a matrix form to display images. An OLED display has technical advantages compared to other display technologies. For example, the OLED display has a self-emission characteristic, which avoids the need for a backlight unit to be used as a light source.

Each pixel in an OLED display includes a light-emitting device and a pixel driving circuit. A plurality of thin film transistors and storage capacitors are also included for independently driving the light-emitting device.

A light-emitting device may include an organic emission layer located between an anode electrode (a pixel electrode) and a cathode electrode. The cathode electrode may comprise a transparent conductive material and may be formed on the entirety of pixels of the display panel.

A driving voltage (ELVDD) is a high-potential voltage that is supplied to the anode electrode. A low driving voltage (ELVSS) is a low-potential voltage that is supplied to the cathode electrode. The driving voltage (ELVDD) and the low driving voltage (ELVSS) may be supplied to one side of the display panel of the OLED display and may be supplied to the respective light-emitting devices from the driving circuit for driving the display panel.

The above information disclosed in this Background section is only for enhancement of understanding of the background of the invention and therefore it may contain information that does not form the prior art that is already known in this country to a person of ordinary skill in the art.

SUMMARY

Embodiments of the present invention prevent heat from being generated at a lower portion of a display panel when a current is gathered at an end of a low driving voltage (ELVSS) wire in an organic light emitting diode (OLED) display.

An exemplary embodiment of the present invention provides an OLED display including: a substrate including a display area and a non-display area; a metal layer disposed on the non-display area of the substrate; a gate insulating layer covering the metal layer and the substrate, wherein the gate insulating layer comprises an inorganic material; a first voltage line disposed on the gate insulating layer and receiving a driving voltage; a second voltage line disposed on the gate insulating layer and receiving a low driving voltage, wherein the low driving voltage is lower than the driving voltage; an organic insulating layer covering the first voltage line and the second voltage line; and a cathode electrode formed on the organic insulating layer, wherein the second voltage line and the cathode electrode are electrically connected to each other through an opening formed in the organic insulating layer, and the first voltage line or the second voltage line is electrically connected to the metal layer through an opening formed in the gate insulating layer.

The second voltage line may be disposed to surround four sides of the display area.

The first voltage line may be disposed to partially overlap the second voltage line in the non-display area.

The organic insulating layer may include: an interlayer insulating layer disposed to cover the first voltage line disposed on the gate insulating layer; a passivation layer disposed to cover the second voltage line disposed on the interlayer insulating layer; and an upper organic layer disposed on the passivation layer.

The OLED display may further include: a first voltage applying connector disposed on the gate insulating layer; and a first voltage applying wire disposed on the interlayer insulating layer, wherein the first voltage applying wire may be electrically connected to the first voltage applying connector through an opening formed in the interlayer insulating layer, and the first voltage applying connector may be electrically connected to the metal layer through an opening formed in the gate insulating layer.

The first voltage line may be electrically connected to the metal layer through an opening formed in the gate insulating layer.

The OLED display may further include: an anode electrode disposed between the passivation layer and the upper organic layer; and an organic emission layer disposed on the anode electrode, wherein the cathode electrode may be disposed on the organic emission layer.

The OLED display may further include a cathode electrode connector disposed on the passivation layer, wherein the cathode electrode connector may be electrically connected to the cathode electrode through an opening formed in the upper organic layer, and the cathode electrode connector may be electrically connected to the second voltage line through an opening formed in the passivation layer.

The OLED display may further include a second voltage line connector disposed on the gate insulating layer, wherein the second voltage line connector may be electrically connected to the second voltage line through an opening formed in the interlayer insulating layer.

The second voltage line may be disposed to surround at least three sides of the display area.

The organic insulating layer may include: an interlayer insulating layer disposed to cover the first voltage line disposed on the gate insulating layer; a passivation layer disposed to cover the second voltage line disposed on the interlayer insulating layer; and an upper organic layer disposed on the passivation layer.

The OLED display may further include a first voltage line auxiliary connector disposed on the gate insulating layer, wherein the first voltage line may be disposed on the interlayer insulating layer, and may be electrically connected to the first voltage line auxiliary connector through an opening formed in the interlayer insulating layer.

The OLED display may further include a second voltage line connector disposed on the gate insulating layer, wherein the second voltage line connector may be electrically connected to the metal layer through an opening formed in the gate insulating layer, and the second voltage line may be electrically connected to the second voltage line connector through an opening formed in the interlayer insulating layer.

The OLED display may further include a cathode electrode connector disposed on the passivation layer, wherein the cathode electrode connector may be electrically connected to the cathode electrode through an opening formed in the upper organic layer, and the cathode electrode connector may be electrically connected to the second voltage line through an opening formed in the passivation layer.

The OLED display may further include: a second voltage applying connector disposed on the gate insulating layer; and a second voltage applying wire disposed on the interlayer insulating layer, wherein the second voltage applying wire may be electrically connected to the second voltage applying connector through an opening formed in the interlayer insulating layer, and the second voltage applying connector may be electrically connected to the metal layer through an opening formed in the gate insulating layer.

The second voltage line may be disposed to surround three sides of the display area.

Another embodiment of the present invention provides an OLED display including: a substrate including a display area and a non-display area; a gate insulating layer disposed on the substrate; a first voltage line disposed on the gate insulating layer and receiving a driving voltage; an inorganic insulating layer covering the first voltage line and the gate insulating layer; an interlayer insulating layer disposed on the inorganic insulating layer; a second voltage line disposed on the interlayer insulating layer and receiving a low driving voltage, wherein the low driving voltage is lower than the driving voltage; an organic insulating layer disposed on the second voltage line; and a cathode electrode disposed on the organic insulating layer, wherein the second voltage line and the cathode electrode may be electrically connected to each other through an opening formed in the organic insulating layer, and the first voltage line and the second voltage line may be disposed to partially overlap each other at a lower portion of the non-display area in a plan view.

The second voltage line may be disposed to surround four sides of the display area.

The organic insulating layer may include: a passivation layer disposed to cover the second voltage line disposed on the interlayer insulating layer; and an upper organic layer disposed on the passivation layer.

The OLED display may further include: an anode electrode disposed between the passivation layer and the upper organic layer; and an organic emission layer disposed on the anode electrode, wherein the cathode electrode may be disposed on the organic emission layer.

According to the exemplary embodiments, the metal layer may be formed on the lower portion of the non-display area to apply a driving voltage or a low driving voltage, and the inorganic insulating layer may be formed between the driving voltage line and the low driving voltage line to reduce heat generated by the lower portion of the display panel.

The metal layer may be formed on the lower portion of the non-display area to apply a driving voltage or a low driving voltage, and the low driving voltage wire may be formed partially in the non-display area to reduce the dead space between the display unit and the pad unit.

In yet another embodiment, a display device may include a metal layer disposed on a non-display area of a substrate; a gate insulating layer comprising an inorganic material; a first voltage line disposed on the gate insulating layer and configured to receive a driving voltage; and a second voltage line disposed on the gate insulating layer and configured to receive a low driving voltage, wherein the low driving voltage is lower than the driving voltage; wherein the first voltage line or the second voltage line is electrically connected to the metal layer through an opening formed in the gate insulating layer, and wherein the gate insulating layer is configured to prevent current buildup in the second voltage line.

DETAILED DESCRIPTION OF THE EMBODIMENTS

Figure 1:
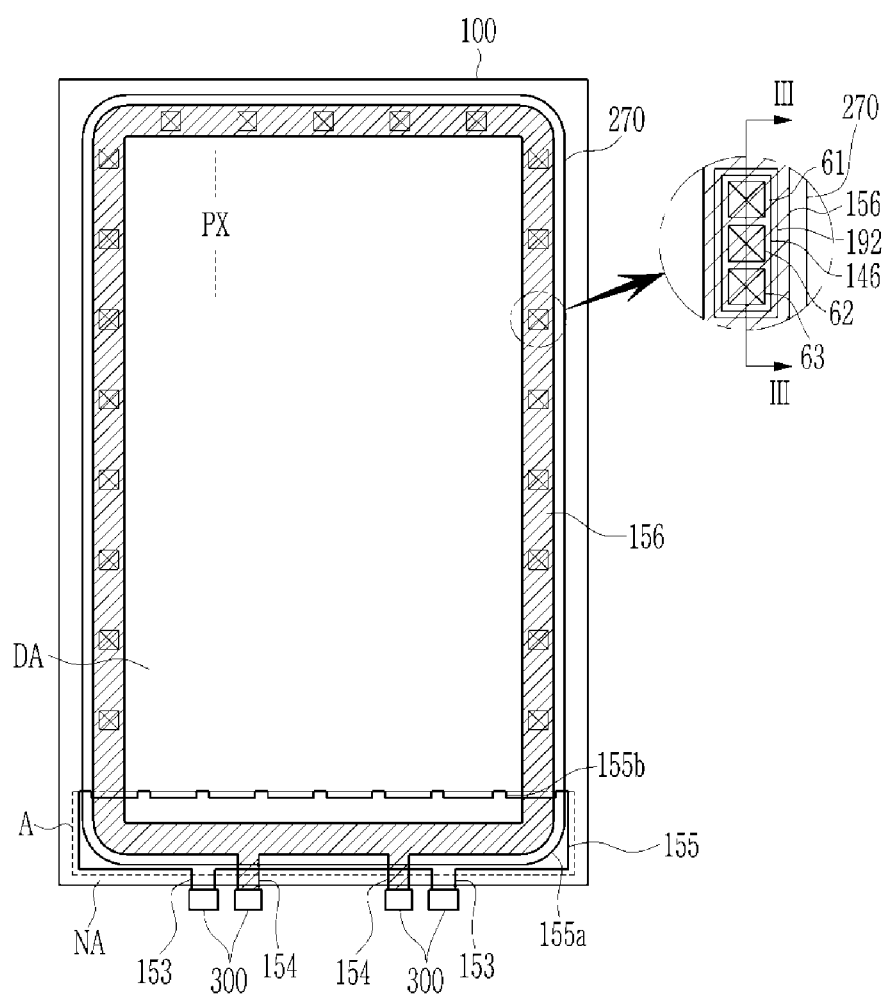
FIG. 1 shows a plan view and an enlarged view of an organic light emitting diode (OLED) display according to an exemplary embodiment.

The present disclosure describes an organic light emitting diode (OLED) display in which a driving voltage line and a low driving voltage line are configured to prevent heat from being generated at a lower portion of a display panel.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

The size and thickness of each configuration shown in the drawings are arbitrarily shown for better understanding and ease of description, and the present invention is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

An OLED display in which a driving voltage line and a low driving voltage line are disposed according to an exemplary embodiment will now be described with reference to FIG. 1 to FIG. 3.

Figure 2:
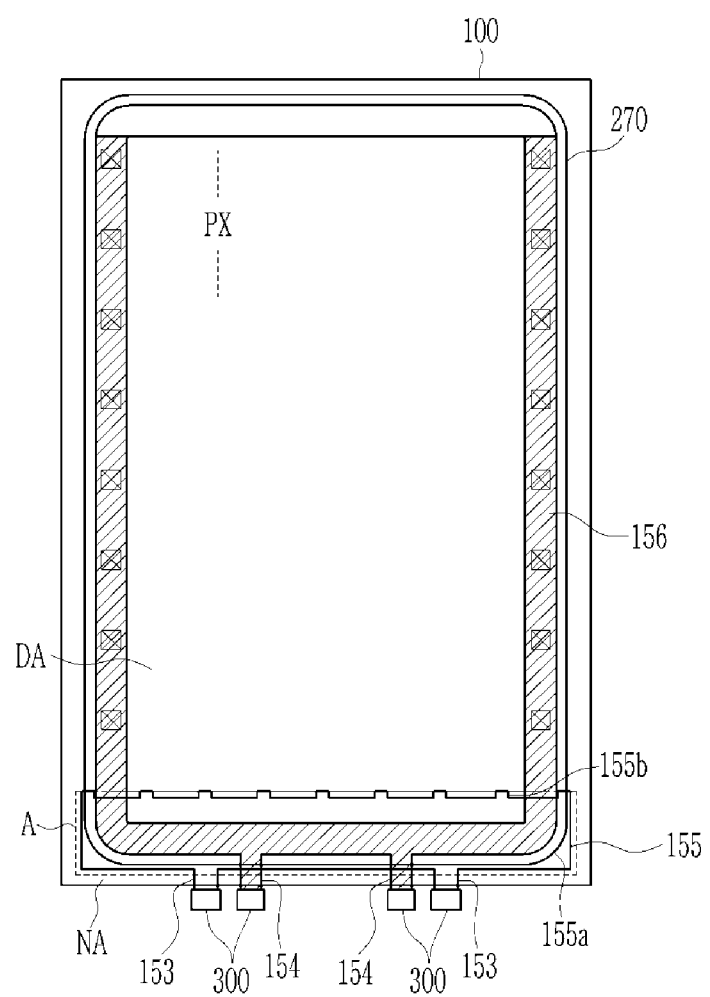
FIG. 2 shows a plan view of an OLED display according to an exemplary embodiment.
Figure 3:
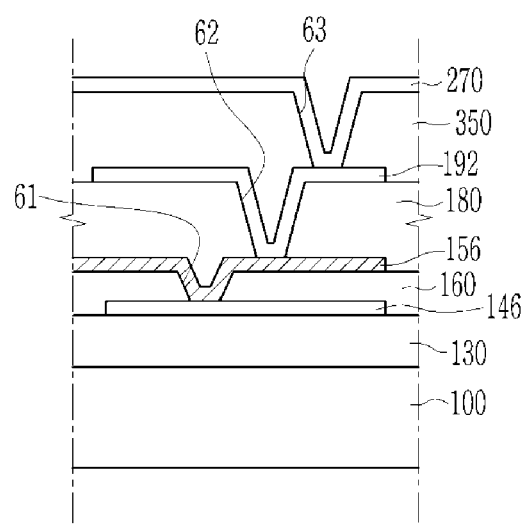
FIG. 3 shows a cross-sectional view with respect to a line of FIG. 1.

FIG. 1 shows a plan view and an enlarged view of an OLED display according to an exemplary embodiment, FIG. 2 shows a plan view of an OLED display according to an exemplary embodiment, and FIG. 3 shows a cross-sectional view with respect to a line of FIG. 1.

Referring to FIG. 1 to FIG. 3, the OLED display includes a substrate 100, a second voltage line auxiliary connector 146, a second voltage line 156, a cathode electrode connector 192, and a cathode electrode 270. The second voltage line auxiliary connector 146, the second voltage line 156, the cathode electrode connector 192, and the cathode electrode 270 are sequentially formed on the substrate 100. These layers are insulated from each other with an insulating layer therebetween, as long as the second voltage line auxiliary connector 146, the second voltage line 156, the cathode electrode connector 192, and the cathode electrode 270 are not connected by an opening. More specifically, the second voltage line auxiliary connector 146, the second voltage line 156, the cathode electrode connector 192, and the cathode electrode 270 are insulated sequentially with an organic insulating layer therebetween. In FIG. 1 to FIG. 3, the organic insulating layer, including an interlayer insulating layer 160, a passivation layer 180, and an upper organic layer 350 is described.

Referring to FIG. 1 and FIG. 2, the substrate 100 includes a display area (DA) and a non-display area (NA). The display area (DA) is a region for displaying an image, and a pixel PX including a thin film transistor and an OLED is formed in the display area (DA). The non-display area (NA) is a region in which no image is displayed. A first voltage line 155 and the second voltage line 156 for transmitting voltages and signals to the pixel PX formed in the display area (DA), and a plurality of pads 300 are formed in the non-display area (NA). In an exemplary embodiment, the first voltage line 155 is a wire for supplying a driving voltage (ELVDD) to a thin film transistor of the display area (DA). The second voltage line 156 is a wire for supplying a low driving voltage (ELVSS) to the cathode electrode 270 of the OLED configured with an anode electrode (191 of FIG. 12 hereinafter), an organic emission layer (370 of FIG. 12 hereinafter), and the cathode electrode 270.

The first voltage line 155 is a wire for applying a driving voltage (ELVDD) to the display area (DA), and is formed in the non-display area (NA). The first voltage line 155 also includes an overlapping portion 155a formed in a lower portion (region A) of the non-display area (NA). A first voltage applying wire 153 extends to a plurality of pads 300 from the overlapping portion 155a, and a plurality of wires 155b extending toward the display area (DA) from the overlapping portion 155a. The overlapping portion 155a of the first voltage line 155 overlaps the second voltage line 156. The first voltage applying wire 153 may be a portion of wire for receiving the driving voltage (ELVDD) from the pad 300, and a plurality of wires are portions connected to the display area (DA) and applying the driving voltage (ELVDD). The overlapping portion 155a and the wires 155b receive the driving voltage (ELVDD) and apply the driving voltage (ELVDD) to the pixel PX of the display area (DA). Although not shown, the plurality of wires 155b may be formed to extend in a vertical direction in the display area (DA).

The second voltage line 156 is a wire for supplying a low driving voltage (ELVSS) to the cathode electrode 270 of the OLED. The second voltage line 156 is formed to surround the edge of the display area (DA). More specifically, the second voltage line 156 is formed in upper, lower, right, and left regions of the non-display area (NA) surrounding the display area (DA). Depending on exemplary embodiments, the second voltage line 156 may be formed on one of the upper, lower, right, and left regions of the non-display area (NA) so that the same may surround at least one portion of the display area (DA). In detail, referring to FIG. 2, second voltage line 156 is formed to surround the lower, right, and left regions of the non-display area (NA).

The second voltage line 156 is formed to overlap the first voltage line 155 on the lower portion of the non-display area (NA) and is also formed to surround four sides of the display area (DA). Thus, a current flowing to the cathode electrode 270 may not be gathered in any particular region but may flow in the entire region. The second voltage line 156 is electrically connected to the cathode electrode 270 through a plurality of contact holes in the upper, right, and left regions of the non-display area (NA). A connection of the second voltage line 156 and the cathode electrode 270 will be described with reference to FIG. 4 to be described in a latter portion of the present specification.

The plurality of pads 300 include a first pad for applying a driving voltage to a first voltage line 155 and a first voltage applying wire 153 connected to the first voltage line 155. The plurality of pads 300 may also include a second pad for applying a low driving voltage to a second voltage line 156 and a second voltage applying wire 154 connected to the second voltage line 156.

The cathode electrode 270 is an electrode on another side of the OLED and is formed on the display panel. The cathode electrode 270 is formed to cover the display area (DA), and is formed to cover part of the upper, lower, right, and left regions of the non-display area (NA). The cathode electrode 270 is formed to completely cover the second voltage line 156 formed in the upper, right, and left regions of the non-display area (NA) and is formed to partially cover the second voltage line 156 formed in the lower region in the plan view. In an exemplary embodiment, the second voltage applying wire 154 may not be covered by the cathode electrode 270. The cathode electrode 270 is formed to cover the first voltage line 155 formed in the lower region of the non-display area (NA) in the plan view. The first voltage applying wire 153 may not be covered by the cathode electrode 270.

A display device may include a substrate 100 with a display area DA and a non-display area NA. The non-display area NA may include a metal layer; a gate insulating layer comprising an inorganic material; a first voltage line 155 disposed on the gate insulating layer and configured to receive a driving voltage; and a second voltage line 156 disposed on the gate insulating layer and configured to receive a low driving voltage; wherein the first voltage line 155 or the second voltage line 156 is electrically connected to the metal layer through an opening formed in the gate insulating layer, and wherein the gate insulating layer 130 is configured to prevent current buildup in the second voltage line 156.

FIG. 1 shows an enlarged portion in which the cathode electrode 270 contacts the second voltage line 156 in a left disposal drawing. With reference to the enlarged diagram on the right side of FIG. 1, the cathode electrode 270 is connected to the cathode electrode connector 192 through an opening 63. The cathode electrode connector 192 is connected to the second voltage line 156 through an opening 62. The second voltage line 156 is connected to the second voltage line auxiliary connector 146 through an opening 61.

In detail, referring to FIG. 3, the substrate 100 may be formed of a glass substrate, or a flexible substrate including plastic and a polyimide (PI).

Figure 13:
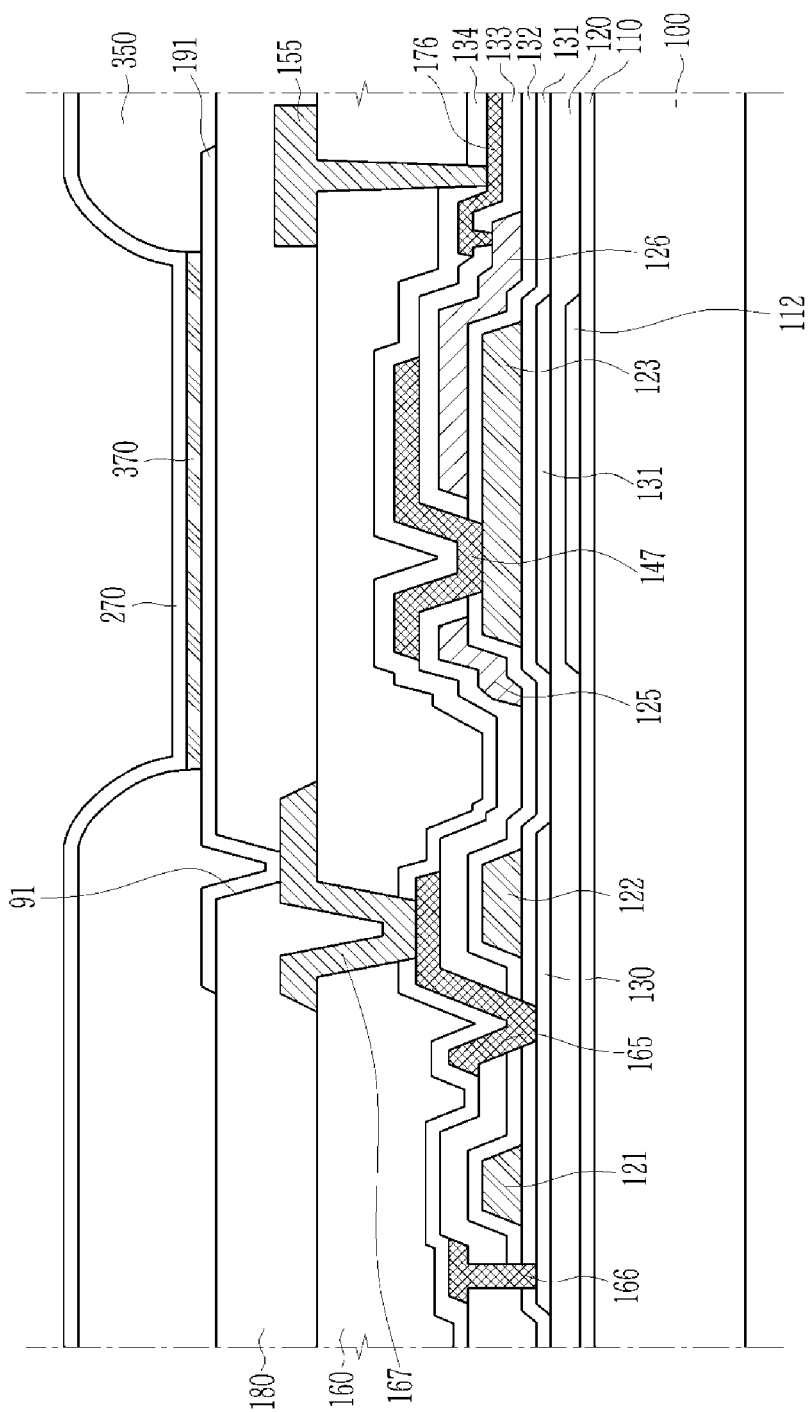
FIG. 13 shows a cross-sectional view of a display area of an OLED display according to an exemplary embodiment.

A gate insulating layer 130 is formed on the substrate 100. The gate insulating layer 130 includes an inorganic material and may be made of a silicon nitride (SiNx) or a silicon oxide (SiO$_x$). The gate insulating layer 130 may include a first gate insulating layer 131, a second gate insulating layer 132, a third gate insulating layer 133, and a fourth gate insulating layer 134 (as illustrated in FIG. 13). In an exemplary embodiment, a barrier layer (110 of FIG. 5 hereinafter) and an inorganic insulating layer of a buffer layer (120 of FIG. 5 hereinafter) may be additionally formed between the substrate 100 and the gate insulating layer 130.

A second voltage line auxiliary connector 146 is formed on the gate insulating layer 130. The second voltage line auxiliary connector 146 is an island-type electrode and is formed partially on the gate insulating layer 130.

An interlayer insulating layer 160 is formed on the second voltage line auxiliary connector 146. An opening 61 for exposing the second voltage line auxiliary connector 146 is formed in the interlayer insulating layer 160. The interlayer insulating layer 160 may be an organic insulating layer made of an organic material.

A second voltage line 156 is formed on the interlayer insulating layer 160. The second voltage line 156 is provided to overlap the second voltage line auxiliary connector 146 and is electrically connected to the second voltage line auxiliary connector 146 through the opening 61.

A passivation layer 180 is formed on the second voltage line 156. The passivation layer 180 is an organic insulating layer made of an organic material, and has characteristics of removing steps and flattening the same.

A cathode electrode connector 192 is formed on the passivation layer 180. The cathode electrode connector 192 applies a low driving voltage (ELVSS) to the cathode electrode 270 which may be another electrode of the OLED. The cathode electrode connector 192 is provided to overlap the second voltage line 156 and is electrically connected to the second voltage line 156 through the opening 62.

An upper organic layer 350 is formed on the cathode electrode connector 192 and may be an organic insulating layer made of an organic material.

A cathode electrode 270 is formed on the upper organic layer 350, and may overlap the cathode electrode connector 192, and is electrically connected to the cathode electrode connector 192 through the opening 63. That is, the cathode electrode 270 receives the low driving voltage (ELVSS) from the second voltage line 156 through the cathode electrode connector 192.

In an exemplary embodiment, the second voltage line 156 and the cathode electrode 270 have been described to be connected through the cathode electrode connector 192. In some examples, the second voltage line 156 and the cathode electrode 270 may be directly connected through an opening passing through an organic insulating layer and not by the cathode electrode connector 192.

In the above, it has been described that the first voltage line 155 overlaps the second voltage line 156 at the lower portion of the non-display area (NA) and the cathode electrode 270 is electrically connected to the second voltage line 156.

In FIG. 4 to FIG. 9, an exemplary embodiment is described in which the first voltage line 155 overlaps the second voltage line 156 at the lower portion of the non-display area (NA) of the OLED display and a metal layer 111 is further formed at the lower portion of the non-display area (NA).

Figure 4:
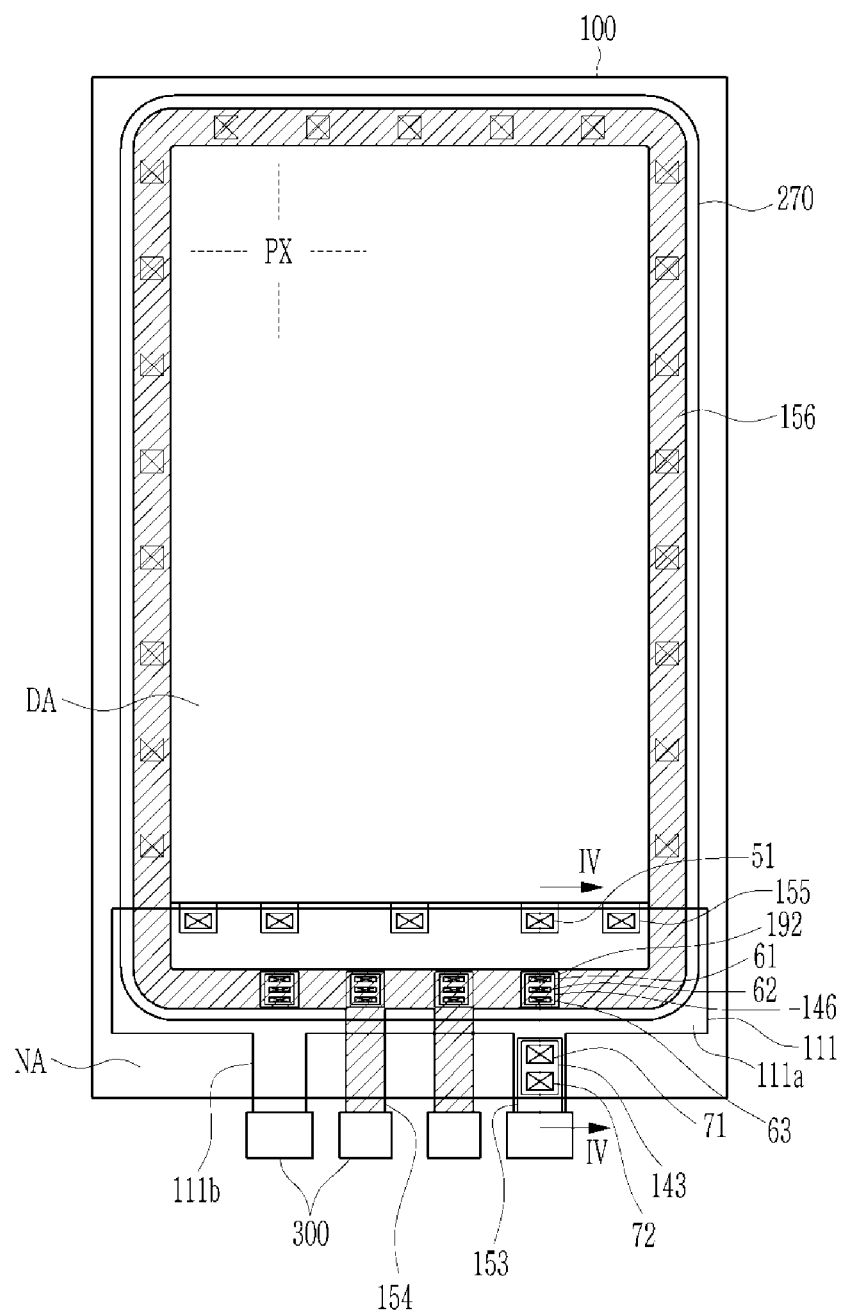
FIG. 4 shows a plan view of an OLED display according to an exemplary embodiment.
Figure 5:
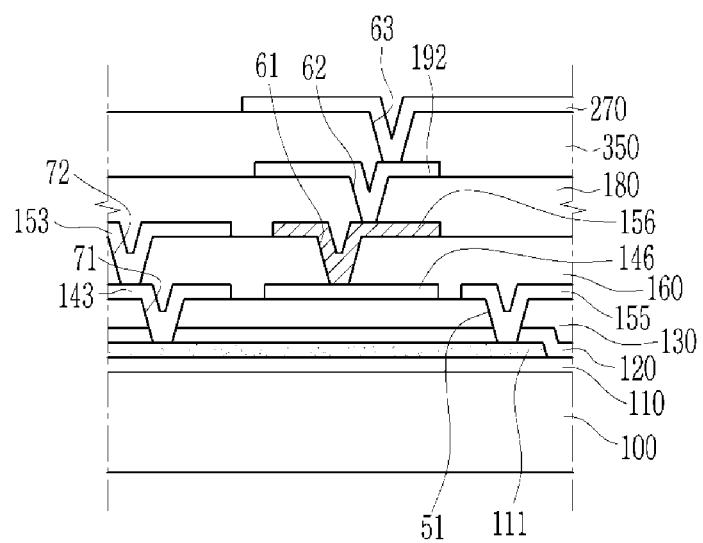
FIG. 5 shows a cross-sectional view with respect to a line IV-IV of FIG. 4.
Figure 6:
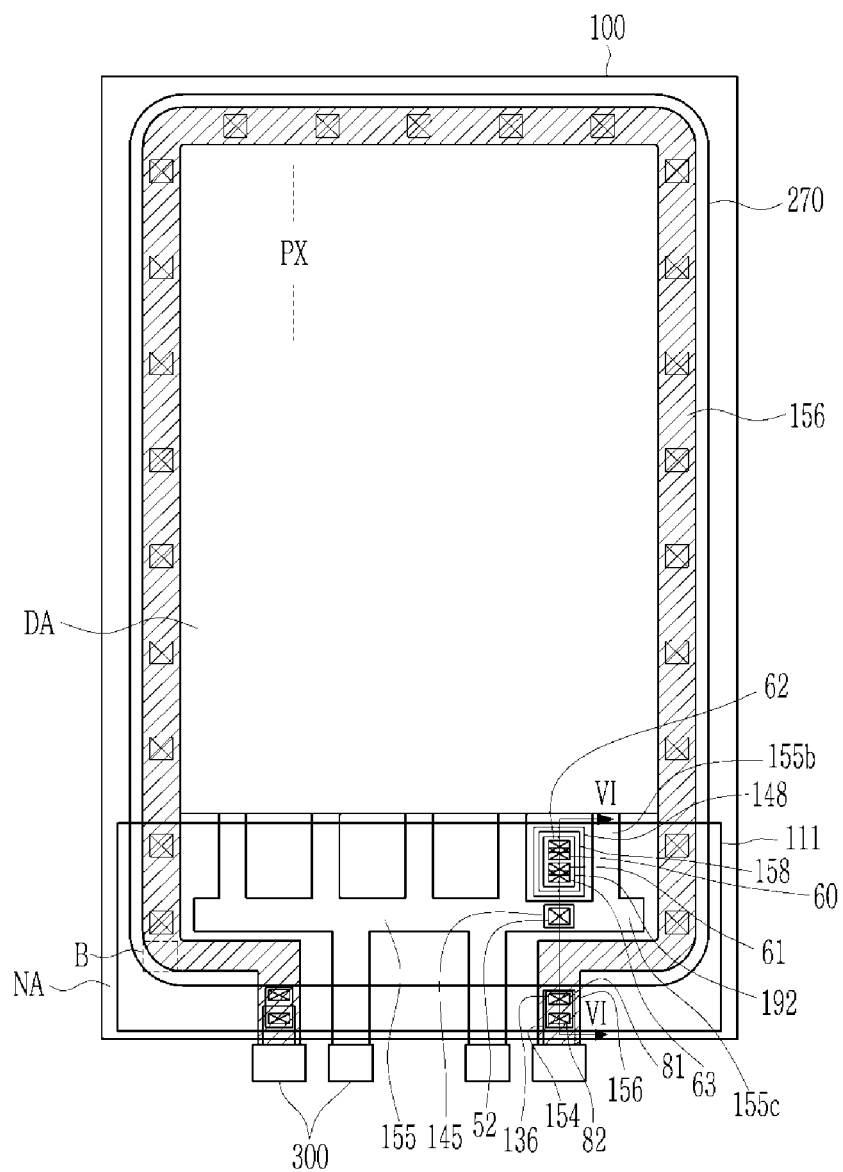
FIG. 6 shows a plan view of an OLED display according to an exemplary embodiment.
Figure 7:
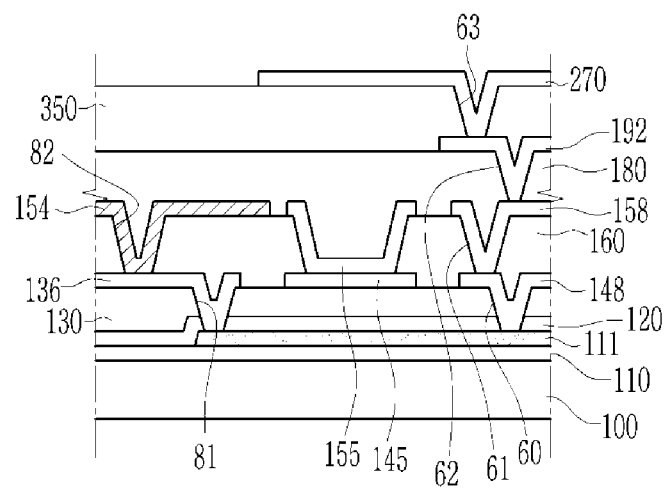
FIG. 7 shows a cross-sectional view with respect to a line VI-VI of FIG. 6.
Figure 8:
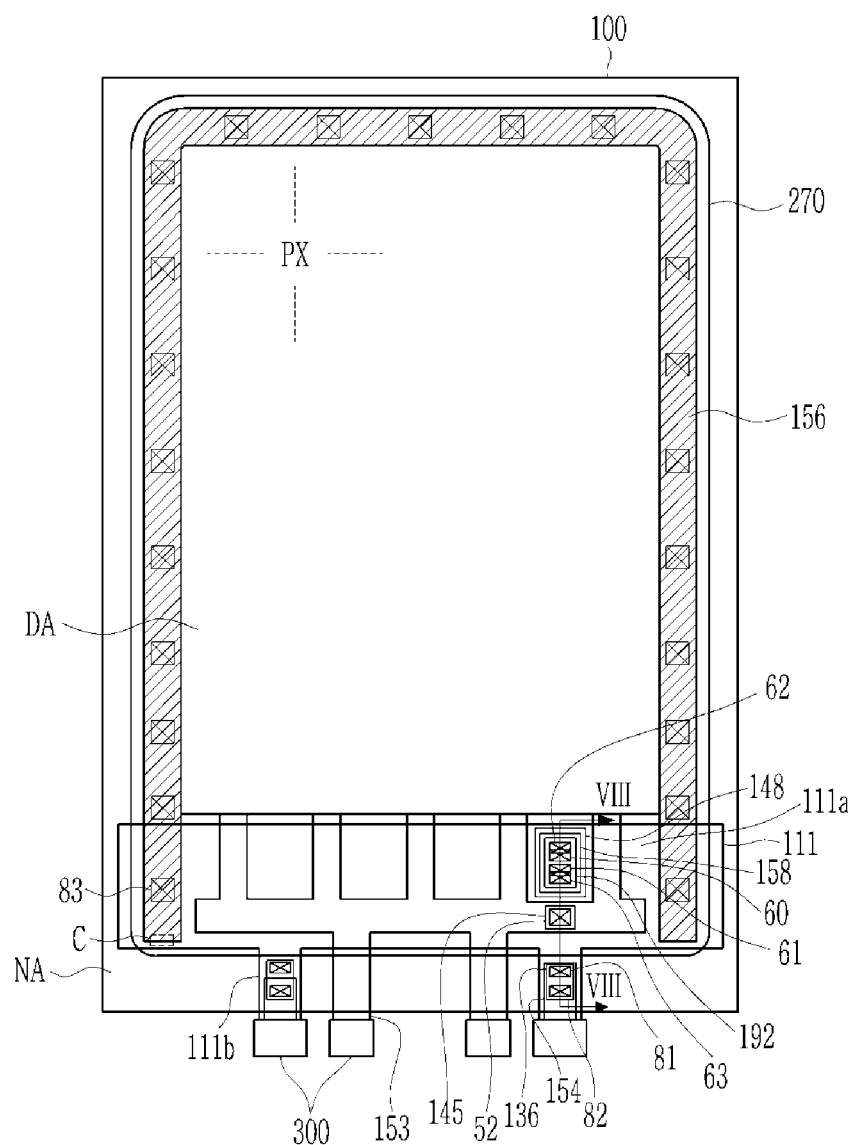
FIG. 8 shows a plan view of an OLED display according to an exemplary embodiment.
Figure 9:
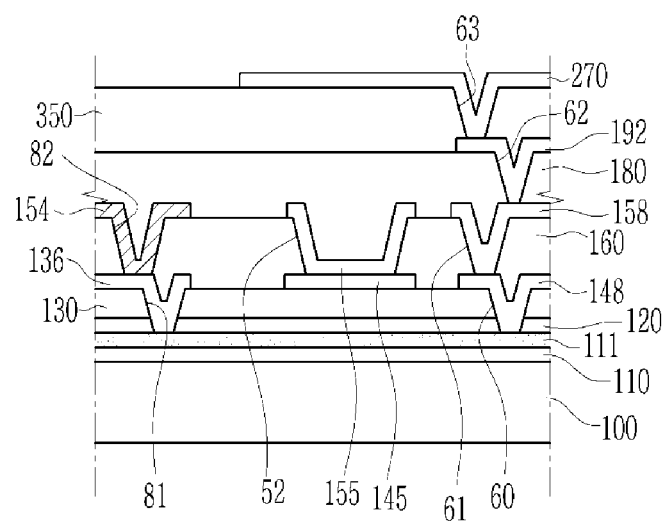
FIG. 9 shows a cross-sectional view with respect to a line VIII-VIII of FIG. 8.

FIG. 4 shows a plan view of an OLED display according to an exemplary embodiment and FIG. 5 shows a cross-sectional view with respect to a line IV-IV of FIG. 4. FIG. 6 shows a plan view of an OLED display according to an exemplary embodiment and FIG. 7 shows a cross-sectional view with respect to a line VI-VI of FIG. 6. FIG. 8 shows a plan view of an OLED display according to an exemplary embodiment and FIG. 9 shows a cross-sectional view with respect to a line VIII-VIII of FIG. 8.

Referring to FIG. 4 and FIG. 5, the OLED display according to an exemplary embodiment includes a substrate 100, first data wire layers (143, 146, and 155, and 136, 148, and 158 shown in FIG. 6), second data wire layers (153 and 156, and 146 and 155 shown in FIG. 6), a cathode electrode connector 192, and a cathode electrode 270. The first data wire layers (143, 146, 155, 136, 148, and 158), the second data wire layers (153, 156, 146, and 155), the cathode electrode connector 192, and the cathode electrode 270 are sequentially formed on the substrate 100. These layers are insulated from each other with an insulating layer therebetween as long as the first data wire layers (143, 146, 155, 136, 148, and 158), the second data wire layers (153, 156, 146, and 155), the cathode electrode connector 192, and the cathode electrode 270 are not connected by an opening. In the exemplary embodiment, the insulating layer includes an inorganic insulating layer or an organic insulating layer, and the organic insulating layer includes an interlayer insulating layer 160, a passivation layer 180, and an upper organic layer 350.

The substrate 100 may be formed of a flexible substrate 100 including plastic and a polyimide (PI).

A barrier layer 110 is formed on the substrate 100. The barrier layer 110 may be formed of an inorganic material.

A metal layer 111 is formed on the barrier layer 110. The metal layer 111 transmits the driving voltage (ELVDD). The metal layer 111 includes an overlapping portion 111*a* formed in a horizontal direction in the non-display area (NA), and a lower portion extension 111*b* extending in a vertical direction from the overlapping portion 111*a* and connected to the pad 300. An upper region of the overlapping portion 111*a* overlaps an end of the first voltage line 155 in the vertical direction and overlaps a second voltage line 156 in the horizontal direction. The lower portion extension 111*b* partially overlaps a first voltage applying connector 143 and a first voltage applying wire 153.

The buffer layer 120 is formed on the metal layer 111 and covers the substrate 100 and the metal layer 111. The buffer layer 120 may be formed of an inorganic insulating material.

The gate insulating layer 130 is formed on the buffer layer 120, and the gate insulating layer 130 may be made of an inorganic insulating material.

The first data wire layers (143, 146, 155, 136, 148, and 158) are formed on the gate insulating layer 130. The first data wire layers (143, 146, 155, 136, 148, and 158) include a first voltage applying connector 143, a second voltage line auxiliary connector 146, and a first voltage line 155.

The first voltage applying connector 143 transmits the driving voltage (ELVDD) to the metal layer 111. The first voltage applying connector 143 overlaps part of the lower portion extension 111b of the metal layer 111. The first voltage applying connector 143 has an island-type structure and is connected to the lower portion extension 111b of the metal layer 111 through an opening 72.

The second voltage line auxiliary connector 146 is an auxiliary electrode for applying a low driving voltage (ELVSS) to the second voltage line 156. The second voltage line auxiliary connector 146 is formed to overlap the overlapping portion 111a of the metal layer 111 and the second voltage line 156.

The first voltage line 155 is a wire for applying a driving voltage (ELVDD) to the display area (DA) and is formed in the non-display area (NA). The first voltage line 155 partially overlaps an upper region of the overlapping portion 111a of the metal layer 111. The first voltage line 155 is electrically connected to the metal layer 111 by an opening 51. Although not shown, a plurality of wires 155b may be formed to extend in the display area (DA) in the vertical direction.

The first data wire layers 143, 146, 155, 136, 148, and 158 and the gate insulating layer 130 are covered with an interlayer insulating layer 160. The interlayer insulating layer 160 may be formed of an organic material.

Second data wire layers 153 and 156, and 146 and 155 shown in FIG. 6 are formed on the interlayer insulating layer 160. The second data wire layers 146, 153, 155, and 156 include a first voltage applying wire 153 and a second voltage line 156.

The first voltage applying wire 153 is connected to the pad 300 to transmit the driving voltage (ELVDD) which overlaps the first voltage applying connector 143. The first voltage applying wire 153 is electrically connected to the first voltage applying connector 143 by an opening 71. The first voltage applying wire 153 is formed on a same layer as the first voltage line 155.

The second voltage line 156 is a wire for supplying a low driving voltage (ELVSS) to the cathode electrode 270 of the OLED. The second voltage line 156 may be formed in the upper, lower, right, and left regions of the non-display area (NA) so as to surround the edge of the display area (DA). The second voltage line 156 may be formed to overlap the first voltage line 155 at the lower portion of the non-display area (NA), and may surround four sides of the display area (DA). Thus, a the current flowing to the cathode electrode 270 may not be gathered in any particular region, but may flow in the entire region. The second voltage line 156 is formed to partially overlap the overlapping portion 111a of the metal layer 111 in the horizontal direction and is formed to partially overlap the second voltage line 156. The second voltage line 156 is electrically connected to the second voltage line auxiliary connector 146 by the opening 61.

Referring to FIG. 4, the second voltage line 156 is shown to have a region overlapping the first voltage line 155 at the lower portion of the non-display area (NA). Referring to FIG. 4 and FIG. 5, the low driving voltage (ELVSS) is applied to the second voltage line 156 through the second voltage applying wire 154 formed on the same layer. The first voltage line 155 transmits the driving voltage (ELVDD) applied by the pad 300 to the first voltage applying wire 153. The first voltage applying wire 153 transmits the driving voltage (ELVDD) to the first voltage applying connector 143 connected through the opening 72. The first voltage applying connector 143 transmits the driving voltage (ELVDD) to the metal layer 111 connected through the opening 71. The first voltage line 155 connected to the metal layer 111 through the opening 51 applies the driving voltage (ELVDD) to the pixel PX of the display area (DA). In an exemplary embodiment, the driving voltage (ELVDD) and the low driving voltage (ELVSS) are applied with the gate insulating layer 130 made as an inorganic insulating layer therebetween, resulting in a lower likelihood of the first voltage line 155 and the second voltage line 156 being short circuited.

A passivation layer 180 is formed on the second data wire layers 153 and 156 and the interlayer insulating layer 160. The passivation layer 180 is formed of an organic insulating material, and it has the characteristic of removing steps and flattening the same.

A cathode electrode connector 192 is formed on the passivation layer 180. The cathode electrode connector 192 may apply the low driving voltage (ELVSS) to the cathode electrode 270, which may be another electrode of the OLED. The cathode electrode connector 192 is provided to partially overlap the second voltage line 156. The cathode electrode connector 192 is electrically connected to the second voltage line 156 through the opening 62 and is also electrically connected to a cathode electrode 270.

An upper organic layer 350 is formed on the cathode electrode connector 192 and the passivation layer 180. The upper organic layer 350 includes an opening 63 for exposing the cathode electrode connector 192. The upper organic layer 350 may further include an opening (91 in FIG. 13) for exposing an anode electrode (191 in FIG. 13), and an organic emission layer (370 in FIG. 13) may be formed in the opening 91.

A cathode electrode 270 is formed on the upper organic layer 350. The cathode electrode 270 is provided to overlap the cathode electrode connector 192, and it is electrically connected to the cathode electrode connector 192 through the opening 63. That is, the cathode electrode 270 receives the low driving voltage (ELVSS) from the second voltage line 156 through the cathode electrode connector 192.

The structure in which the driving voltage (ELVDD) may be applied through the metal layer 111 has been described with reference to FIG. 4 and FIG. 5, and a structure in which the low driving voltage (ELVSS) is applied through the metal layer 111 will now be described with reference to FIG. 6 to FIG. 9.

Referring to FIG. 6 and FIG. 9, an OLED display according to an exemplary embodiment includes a substrate 100, first data wire layers (136, 146, 155, 143, 148, and 158), second data wire layers (153, 156, 146, and 155), a cathode electrode connector 192, and a cathode electrode 270. The first data wire layers (136, 146, 155, 143, 148, and 158), the second data wire layers (153, 156, 146, and 155), the cathode electrode connector 192, and the cathode electrode 270 are sequentially formed on the substrate 100. These layers are insulated from each other with an insulating layer therebetween as long as the first data wire layers (136, 146, 155, 143, 148, and 158), the second data wire layers (153, 156, 146, and 155), the cathode electrode connector 192, and the cathode electrode 270 are not connected by an opening. The insulating layer may include an inorganic insulating layer or an organic insulating layer, and the organic insulating layer includes an interlayer insulating layer 160, a passivation layer 180, and an upper organic layer 350.

Hereinafter, contents that are different from the above descriptions will be described while omitting the repeated portions.

A barrier layer 110 is formed on the substrate 100.

A metal layer 111 is formed on the barrier layer 110. The metal layer 111 is electrically connected to the second voltage line 156 and transmits the low driving voltage (ELVSS). The metal layer 111 is formed to have a quadrangular shape in the non-display area (NA) and may partially overlap the first voltage line 155, and partially overlaps the second voltage applying connector 136 and the second voltage line auxiliary connector 148.

The first data wire layers (136, 143, 146, 148, 155, and 158) are formed on the gate insulating layer 130, and include a first voltage line auxiliary connector 145, a second voltage applying connector 136, and a second voltage line auxiliary connector 148.

The first voltage line auxiliary connector 145 is an auxiliary electrode for transmitting a driving voltage (ELVDD) to the first voltage line 155. The first voltage line auxiliary connector 145 is formed to be completely overlapped in the metal layer 111 and has an island-shaped structure.

The second voltage applying connector 136 transmits the low driving voltage (ELVSS) to the metal layer 111 and overlaps part of the lower region of the metal layer 111. The second voltage applying connector 136 may be electrically connected to the metal layer 111 by an opening 81.

The second voltage line auxiliary connector 148 transmits the low driving voltage (ELVSS) to a cathode electrode 270 from the metal layer 111. The second voltage line auxiliary connector 148 overlaps part of the upper region of the metal layer 111. The second voltage line auxiliary connector 148 is electrically connected to the metal layer 111 by an opening 60.

Second data wire layers (153, 156, 146) are formed on the interlayer insulating layer 160, which may also include a first voltage line 155, a second voltage applying wire 154, and a second voltage line connector 158.

The first voltage line 155 is a wire for applying the driving voltage (ELVDD) to the display area (DA). The first voltage line 155 includes a horizontal unit 155c formed in the horizontal direction at the lower portion of the non-display area (NA). A first voltage applying wire 153 extends to a plurality of pads 300 from the horizontal unit 155c, and a plurality of wires 155b extending to the display area (DA) from the horizontal unit 155c. A first voltage line auxiliary connector 145 completely overlaps the horizontal unit 155c of the first voltage line 155. The first voltage applying wire 153 receives the driving voltage (ELVDD) from the pad 300, and a plurality of wires 155b are connected to the display area (DA) and apply the driving voltage (ELVDD). Although not shown, a plurality of wires 155b may be formed to extend in the vertical direction in the display area (DA). A second voltage line auxiliary connector 148 is formed among a plurality of wires 155b at the lower portion of the non-display area (NA).

The second voltage applying wire 154 is connected to the pad 300 and transmits the low driving voltage (ELVSS). The second voltage applying wire 154 overlaps the second voltage applying connector 136 and is electrically connected to the second voltage applying connector 136 through an opening 82. The low driving voltage (ELVSS) applied by the second voltage applying wire 154 is transmitted to the metal layer 111 through the second voltage applying connector 136. The second voltage applying wire 154 is a portion connected to the second voltage line 156 and the pad 300, and the second voltage wire 154 and the second voltage line 156 are formed on a same layer.

The second voltage line connector 158 transmits the low driving voltage (ELVSS) to the cathode electrode 270 and is provided to overlap the second voltage line auxiliary connector 148 and is electrically connected to the second voltage line auxiliary connector 148 through an opening 61.

A cathode electrode connector 192 is formed on the passivation layer 180 and is provided to partially overlap the second voltage line connector 158, Additionally, the cathode electrode connector 192 is provided to partially overlap the second voltage line auxiliary connector 148. The cathode electrode connector 192 is electrically connected to the second voltage line connector 158 through the opening 62 and is also electrically connected to a cathode electrode 270.

The cathode electrode 270 is formed on the upper organic layer 350 and is provided to overlap the cathode electrode connector 192 and is electrically connected to the cathode electrode connector 192 through an opening 63. That is, the cathode electrode 270 receives the low driving voltage (ELVSS) from the second voltage line 156 through the cathode electrode connector 192.

Referring to FIG. 6, the second voltage line 156 is formed to surround the upper, right, and left regions of the display area (DA), and is formed in the upper, lower, right, and left regions of the non-display area (NA). However, the second voltage line 156 is formed to be partially opened at the lower portion of the non-display area (NA). Therefore, the current caused by the low driving voltage (ELVSS) applied by the pad 300 on one side may be gathered at an end (a region B) in which the second voltage line 156 overlaps the cathode electrode 270. The low driving voltage (ELVSS), applied through the second voltage applying wire 154 on the pad 300, is applied to the second voltage applying connector 136. The second voltage applying connector 136 is connected to the second voltage applying wire 154 through the opening 82. The metal layer 111 may be connected to the second voltage applying connector 136 through the opening 81.

In an exemplary embodiment, the low driving voltage (ELVSS), applied to the second voltage line auxiliary connector 148 from the metal layer 111 through the opening 61, is applied to the second voltage line connector 158. The second voltage line connector 158 may be connected to the second voltage line auxiliary connector 148 through the opening 62. The low driving voltage (ELVSS) may be applied to the cathode electrode connector 192, connected at the second voltage line connector 158 through the opening 63, and the cathode electrode 270 to which the cathode electrode connector 192 is connected through the opening 63. Therefore, the low driving voltage (ELVSS) applied by the pad 300 may be applied to the cathode electrode 270, thereby dispersing the current gathered at the end (the region B) of the second voltage applying line 156. In addition, the driving voltage (ELVDD) and the low driving voltage (ELVSS) are applied across the gate insulating layer 130 made of an inorganic insulating layer. Thus, the risk of the first voltage line 155 and the second voltage line 156 being short circuited may be reduced, and the generation of burnt defects may be reduced accordingly.

The configuration in which the low driving voltage (ELVSS) is applied through the metal layer 111 has been described in the above with reference to FIG. 6 and FIG. 7. In an exemplary embodiment, the second voltage line 156 is formed at the lower region of the non-display area (NA), so the low driving voltage (ELVSS) is applied through the second voltage applying wire 154 from the pad 300. A predetermined space may be provided in the non-display area (NA) so that the second voltage line 156 may be formed at the lower portion of the non-display area (NA). In some examples, a dead space may be formed.

An exemplary embodiment for reducing the dead space without forming the second voltage line 156 in the lower region of the non-display area (NA) will now be described with reference to FIG. 8 and FIG. 9.

FIG. 8 and FIG. 9 include the content described with reference to FIG. 6 and FIG. 7, so differences will be mainly described.

Referring to FIG. 8, a barrier layer 110 is formed on the substrate 100.

A metal layer 111 is formed on the barrier layer 110. The metal layer 111 is electrically connected to the second voltage line 156 and transmits the low driving voltage (ELVSS). The metal layer 111 includes an overlapping portion 111a formed in the horizontal direction in the non-display area (NA), and a lower portion extension 111b extending in the vertical direction from the overlapping portion 111a and connected to the pad 300. The overlapping portion 111a overlaps the first voltage line 155 and part of the second voltage line auxiliary connector 148. The lower portion extension 111b overlaps the entire region of the second voltage applying connector 136.

The second voltage applying connector 136 transmits the low driving voltage (ELVSS) to the metal layer 111. The second voltage applying connector 136 is electrically connected to the lower portion extension 111b of the metal layer 111 by the opening 81. The entire region of the second voltage applying connector 136 overlaps part of the lower portion extension 111b.

The second voltage applying wire 154 is connected to the pad 300 to transmit the low driving voltage (ELVSS). The second voltage applying wire 154 overlaps the second voltage applying connector 136 and is electrically connected to the second voltage applying connector 136 through the opening 82. The low driving voltage (ELVSS) applied by the second voltage applying wire 154 is transmitted to the metal layer 111 through the second voltage applying connector 136. In an exemplary embodiment, the second voltage applying wire 154 is formed on a same layer as the second voltage line 156.

The second voltage line 156 is formed to surround the upper, right, and left regions of the display area (DA) and is not formed in the lower portion of the non-display area (NA). That is, the second voltage line 156 is formed up to the end (a point C) of the right and left regions of the non-display area (NA). Therefore, to apply the low driving voltage (ELVSS) to the second voltage line 156, it is applied from the pad 300 through the second voltage applying wire 154. The low driving voltage (ELVSS) is also applied to the second voltage applying connector 136, to which the second voltage applying wire 154 is connected through the opening 82. The low driving voltage (ELVSS) is also applied to the metal layer 111, to which the second voltage applying connector 136 is connected through the opening 81.

The low driving voltage (ELVSS) is applied to the second voltage line auxiliary connector 148 through the opening 61 on the metal layer 111. The low driving voltage (ELVSS) is applied to the second voltage line connector 158, to which the second voltage line auxiliary connector 148 is connected through the opening 62. The low driving voltage (ELVSS) is applied to the cathode electrode connector 192, connected through the opening 62 on the second voltage line connector 158, and to the cathode electrode 270 to which the cathode electrode connector 192 is connected through the opening 63.

Referring to FIG. 6, the second voltage line 156 shown in FIG. 6 is formed in part of the upper, right, left, and lower regions of the non-display area (NA), and the second voltage line 156 shown in FIG. 8 is formed in the upper, right, and left portions of the non-display area (NA). The second voltage line 156 shown in FIG. 8 and FIG. 9 is not formed on the lower portion of the non-display area (NA), thereby reducing the dead space between the display area (DA) and a plurality of pads 300. Further, the driving voltage (ELVDD) and the low driving voltage (ELVSS) are applied with the gate insulating layer 130 made of an inorganic insulating layer between them. Thus, the risk of the first voltage line 155 and the second voltage line 156 being short circuited may be reduced, and generation of heat may be reduced accordingly. This may prevent the generation of burnt defects.

An exemplary embodiment has been described in which the first voltage line 155 and the second voltage line 156 partially or wholly overlap each other at the lower portion of the non-display area (NA) of the OLED display. In some cases, the metal layer 111 is further formed at the lower portion of the non-display area (NA) has been described. The OLED display may prevent the heat generated at the lower portion of the non-display area (NA) when it includes an inorganic insulating layer between the first voltage line 155 and the second voltage line 156. A structure in which an inorganic insulating layer is included between the first voltage line 155 and the second voltage line 156 will now be described with reference to FIG. 10 and FIG. 11.

Figure 10:
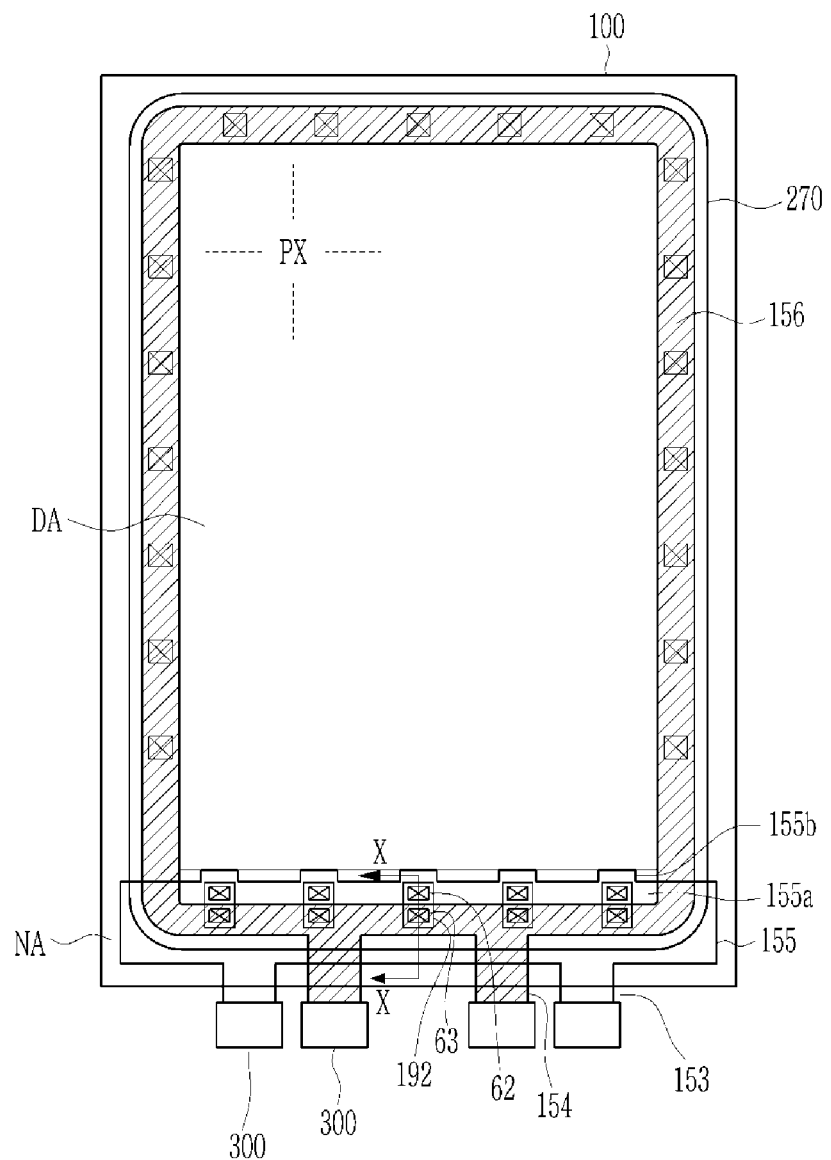
FIG. 10 shows a plan view of an OLED display according to an exemplary embodiment.
Figure 11:
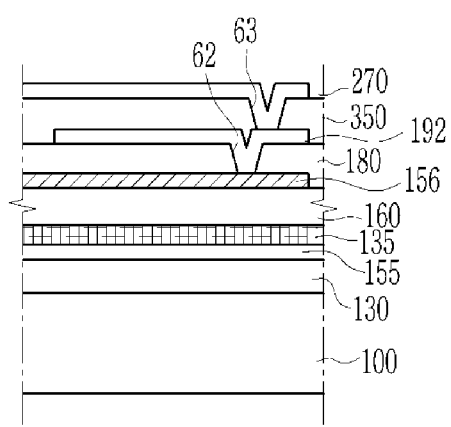
FIG. 11 shows a cross-sectional view with respect to a line X-X of FIG. 10.

Referring to FIG. 10 and FIG. 11, the OLED display according to an exemplary embodiment includes a substrate 100, a first voltage line 155, an inorganic insulating layer 135, a second voltage line 156, a cathode electrode connector 192, and a cathode electrode 270. The first voltage line 155, the second voltage line 156, the cathode electrode connector 192, and the cathode electrode 270 are sequentially formed on the substrate 100. These layers are insulated from each other with an insulating layer therebetween as long as the first voltage line 155, the second voltage line 156, the cathode electrode connector 192, and the cathode electrode 270 are not connected by an opening. In an exemplary embodiment, the insulating layer includes an inorganic insulating layer or an organic insulating layer, and the organic insulating layer includes an interlayer insulating layer 160, a passivation layer 180, and an upper organic layer 350 to be described.

A gate insulating layer 130 is formed on the substrate 100. The gate insulating layer 130 may be formed of an inorganic material. An inorganic insulating layer including a barrier layer 110 and a buffer layer 120 may be further formed between the substrate 100 and the gate insulating layer 130.

A first voltage line 155 is formed on the gate insulating layer 130. The first voltage line 155 includes an overlapping portion 155a formed in the horizontal direction in the non-display area (NA). A first voltage applying wire 153 extends to a plurality of pads 300 from the overlapping portion 155a, and a plurality of wires 155b extending to the display area (DA) from the overlapping portion 155a. The overlapping portion 155a of the first voltage line 155 overlaps the second voltage line 156. The first voltage applying wire 153 receives the driving voltage (ELVDD) from the pad 300, and a plurality of wires are connected to the display area (DA) to apply the driving voltage (ELVDD). The overlapping portion 155a and the plurality of wires 155b receive the driving voltage (ELVDD) and apply the driving voltage (ELVDD) to the pixel PX of the display area (DA). Although not shown, the wires 155b may be formed to extend in the vertical direction in the display area (DA).

An inorganic insulating layer 135 is formed on the first voltage line 155 and the gate insulating layer 130.

An interlayer insulating layer 160 is formed on the inorganic insulating layer 135, and the interlayer insulating layer 160 is formed of an organic material.

A second voltage line 156 is formed on the interlayer insulating layer 160. The second voltage line 156 is formed in the upper, lower, right, and left regions of the non-display area (NA) surrounding the display area (DA).

A passivation layer 180 covers the second voltage line 156 and the interlayer insulating layer 160. The passivation layer 180 may be formed of an organic material.

A cathode electrode connector 192 is formed on the passivation layer 180. The cathode electrode connector 192 is provided to overlap the second voltage line 156 and is electrically connected to the second voltage line 156 through an opening 62.

An upper organic layer 350 is formed on the cathode electrode connector 192. The upper organic layer 350 may be formed of an organic material.

A cathode electrode 270 is formed on the upper organic layer 350. The cathode electrode 270 is provided to overlap the cathode electrode connector 192 and is electrically connected to the cathode electrode connector 192 through an opening 63. That is, the cathode electrode 270 receives the low driving voltage (ELVSS) from the second voltage line 156 through the cathode electrode connector 192.

A large amount of current may flow to the first voltage line 155 and the second voltage line 156 to drive the pixel PX. This may cause the first voltage line 155 and the second voltage line 156 to be short circuited when the organic insulating layer is provided on the portion where the first voltage line 155 overlaps the second voltage line 156. However, the inorganic insulating layer 135 is further formed between the first voltage line 155 and the second voltage line 156 according to an exemplary embodiment, so the burnt defects and the heat generated at the lower portion of the non-display area (NA) may be prevented.

An exemplary embodiment for solving the drawback of generation of heat at the lower portion of the non-display area (NA) of the OLED display has been described.

A configuration of a pixel PX of a display area (DA) of an OLED display will now be described.

Figure 12:
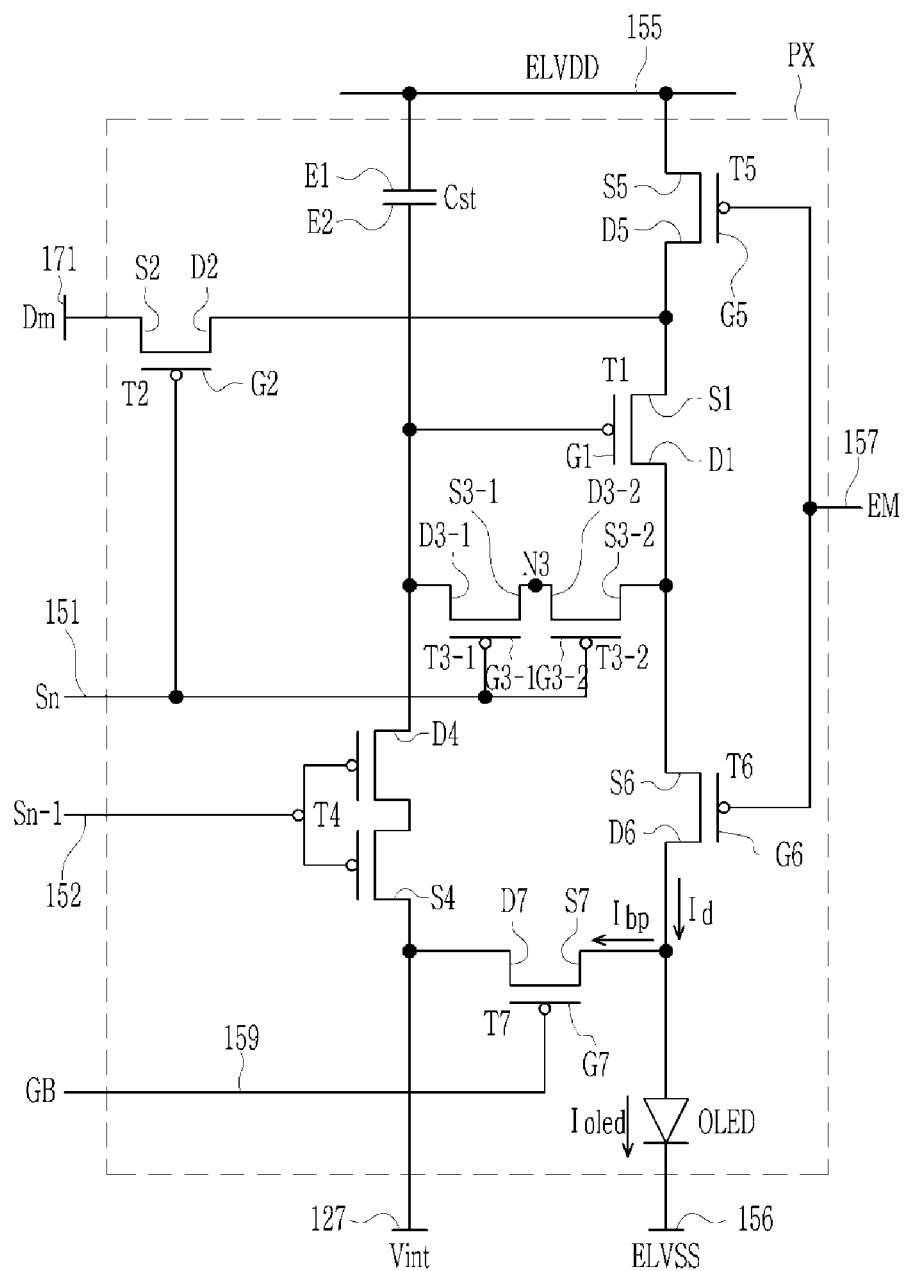
FIG. 12 shows a circuit diagram of a pixel of an OLED display according to an exemplary embodiment.

FIG. 12 shows a circuit diagram of a pixel of an OLED display according to an exemplary embodiment, and FIG. 13 shows a cross-sectional view of a display area of an OLED display according to an exemplary embodiment.

Referring to FIG. 12, the pixel PX of the OLED display includes a plurality of transistors (T1, T2, T3, T4, T5, T6, and T7) connected to signal lines (127, 151, 152, 153, 159, 171, and 172), a storage capacitor Cst, and an OLED.

The plurality of transistors (T1, T2, T3, T4, T5, T6, and T7) include a driving transistor T1, a second transistor T2 and a third transistor T3 that are switching transistors connected to the scan line 151. Other transistors (hereinafter, compensation transistors) for performing operations for operating the OLED display may also be included. The compensation transistors T4, T5, T6, and T7 may include a fourth transistor T4, a fifth transistor T5, a sixth transistor T6, and a seventh transistor T7.

The plurality of signal lines 127, 151, 152, 153, 157, 159, 171, and 172) may include a scan line 151, a previous-stage scan line 152, an emission control line 157, a bypass control line 159, a data line 171, a first voltage line 155, an initialization voltage line 127, and a second voltage line 156. The bypass control line 159 may be part of the previous-stage scan line 152 or may be electrically connected thereto.

The scan line 151 is connected to a gate driver (not shown) and transmits a scan signal (Sn) to the switching transistors, that is, the second transistor T2 and the third transistor T3. The previous-stage scan line 152 is connected to the gate driver and transmits the previous-stage scan signal Sn−1 applied to the pixel PX provided at the previous-stage to the fourth transistor T4. The fourth transistor T4 includes two transistors connected in series, so the previous-stage scan signal Sn−1 is applied to gate electrodes of the two transistors connected in series included in the fourth transistor T4. The emission control line 157 is connected to an emission controller (not shown), and it transmits an emission control signal (EM) for controlling a time for the OLED display to emit light to the fifth transistor T5 and the sixth transistor T6. The bypass control line 159 transmits the bypass signal (GB) to the seventh transistor T7, and it may transmit the same signal as the previous-stage scan signal Sn−1 depending on exemplary embodiments.

The data line 171 is a wire for transmitting a data voltage (Dm) generated by a data driver (not shown), and luminance of light emitted by the OLED changes according to the data voltage (Dm). The first voltage line 155 applies the driving voltage (ELVDD), the initialization voltage line 127 transmits an initialization voltage (Vint) for initializing the driving transistor T1, and the second voltage line 156 applies the low driving voltage (ELVSS). Predetermined voltages may be applied to the first voltage line 155, the initialization voltage line 127, and the second voltage line 156.

The plurality of transistors will now be described.

The driving transistor T1 controls the current output according to the applied data voltage (Dm), the output driving current (Id) is applied to the OLED, and brightness of the OLED is controlled according to the data voltage (Dm). Thus, a first electrode S1 of the driving transistor T1 is disposed to receive the driving voltage (ELVDD), so it is connected to the first voltage line 155 via the fifth transistor T5. Further, the first electrode S1 of the driving transistor T1 is connected to a second electrode D2 of the second transistor T2 to receive the data voltage (Dm). The second electrode (D1; an electrode on the output side) is disposed to output the current to the OLED, and it is connected to an anode electrode of the OLED via the sixth transistor T6. The gate electrode G1 is connected to one electrode (a second storage electrode E2) of the storage capacitor Cst. The voltage at the gate electrode G1 changes according to the voltage charged in the storage capacitor Cst, and the driving current (Id) output by the driving transistor T1 accordingly changes.

The second transistor T2 provides the data voltage (Dm) to the pixel PX. The gate electrode G2 is connected to the scan line 151, and the first electrode S2 is connected to the data line 171. The second electrode D2 of the second transistor T2 is connected to the first electrode S1 of the driving transistor T1. When the second transistor T2 is turned on according to the scan signal (Sn) transmitted through the scan line 151, the data voltage (Dm) transmitted through the data line 171 is transmitted to the first electrode S1 of the driving transistor T1.

The third transistor T3 allows the compensation voltage (Dm+Vth voltage), which may be changed while the data voltage (Dm) passes through the driving transistor T1, to be transmitted to the second storage electrode E2 of the storage capacitor Cst. The third transistor T3 includes a third-1 transistor T3-1 and a third-2 transistor T3-2 connected in series. The gate electrodes G3-1 and G3-2 of the transistors T3-1 and T3-2 are connected to the scan line 151. The first electrode S3-2 of the third-2 transistor T3-2 is connected to the second electrode D1 of the driving transistor T1. The second electrode D3-1 of the third-1 transistor T3-1 is connected to the second storage electrode E2 of the storage capacitor Cst and the gate electrode G1 of the driving transistor T1. In addition, the first electrode S3-1 of the third-1 transistor T3-1 is connected to the second electrode D3-2 of the third-2 transistor T3-2 at a third node N3.

When the third transistor T3 is a single transistor, the first electrode S3-2 of the third-2 transistor T3-2 may be the first electrode of the third transistor T3, and the second electrode D3-1 of the third-1 transistor T3-1 may be the second electrode of the third transistor T3. The third transistor T3 is turned on by the scan signal (Sn), which is provided through the scan line 151 to connect the gate electrode G1 of the driving transistor T1 and the second electrode D1. The third transistor T3 connects the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The gate electrode G4 is connected to the previous-stage scan line 152, and the first electrode S4 is connected to the initialization voltage line 127. The second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 has a structure including two transistors connected in series. The fourth transistor T4 transmits the initialization voltage (Vint) to the gate electrode G1 of the driving transistor T1 and the second storage electrode E2 of the storage capacitor Cst according to the previous-stage scan signal Sn−1 provided through the previous-stage scan line 152. Accordingly, the gate voltage at the gate electrode G1 of the driving transistor T1 and the storage capacitor Cst are initialized. The initialization voltage (Vint) may have a low voltage value and may turn on the driving transistor T1.

The fifth transistor T5 transmits the driving voltage (ELVDD) to the driving transistor T1. The gate electrode G5 is connected to the emission control line 157, and the first electrode S5 is connected to the first voltage line 155. The second electrode D5 of the fifth transistor T5 is connected to the first electrode S1 of the driving transistor T1. The sixth transistor T6 transmits the driving current (Id) output by the driving transistor T1 to the OLED. The gate electrode G6 is connected to the emission control line 157, and the first electrode S6 is connected to the second electrode D1 of the driving transistor T1. The second electrode D6 of the sixth transistor T6 is connected to the anode electrode of the OLED.

The fifth transistor T5 and the sixth transistor T6 are turned on according to the emission control signal (EM) provided through the emission control line 157. When the driving voltage (ELVDD) is applied to the first electrode S1 of the driving transistor T1 through the fifth transistor T5, the driving transistor T1 outputs the driving current (Id) according to a voltage at the gate electrode G1 of the driving transistor T1 (i.e., a voltage at the second storage electrode E2 of the storage capacitor Cst). The output driving current (Id) is transmitted to the OLED through the sixth transistor T6. As the current (Ioled) flows to the OLED, the OLED emits light.

The seventh transistor T7 initializes the anode electrode of the OLED. The gate electrode G7 is connected to the bypass control line 159, the first electrode S7 is connected to the anode electrode of the OLED, and the second electrode D7 is connected to the initialization voltage line 127. The bypass control line 159 may be connected to the previous-stage scan line 152, and the bypass signal (GB) is applied with the same timing as the previous-stage scan signal Sn−1. The bypass control line 159 may not be connected to the previous-stage scan line 152 and may transmit a signal that is different from that of the previous-stage scan signal Sn−1. When the seventh transistor T7 is turned on according to the bypass signal (GB), the initialization voltage (Vint) is applied to the anode electrode of the OLED to be initialized.

The first storage electrode E1 of the storage capacitor Cst is connected to the first voltage line 155. The second storage electrode E2 is connected to the gate electrode G1 of the driving transistor T1, the second electrode D3 of the third transistor T3, and the second electrode D4 of the fourth transistor T4. The second storage electrode E2 may determine the voltage at the gate electrode G1 of the driving transistor T1, may receive the data voltage (Dm) through the second electrode D3 of the third transistor T3, and may receive the initialization voltage (Vint) through the second electrode D4 of the fourth transistor T4.

In addition, the anode electrode of the OLED is connected to the second electrode D6 of the sixth transistor T6 and the first electrode S7 of the seventh transistor T7. The cathode electrode is connected to the second voltage line 156 for transmitting the low driving voltage (ELVSS).

In an exemplary embodiment described with reference to FIG. 12, the pixel circuit includes seven transistors (T1 to T7) and one capacitor Cst, but the present exemplary embodiment is not limited thereto, and the number of transistors, the number of capacitors, and combinations thereof are modifiable in various ways.

Referring to FIG. 13, the OLED display according to an exemplary embodiment includes an overlapped metal layer 112, semiconductor layers 130 and 131, first gate electrode layers 121, 122, and 123, second gate electrode layers 125 and 126, first data electrode layers 165, 166, 147, and 176, second data electrode layers 167 and 155, an anode electrode 191, an organic emission layer 370, and a cathode electrode 270 formed on the substrate 100. The overlapped metal layer 112, semiconductor layers 130 and 131, first gate electrode layers 121, 122, and 123, second gate electrode layers 125 and 126, first data electrode layers 165, 166, 147, and 176, second data electrode layers 167 and 155, an anode electrode 191, an organic emission layer 370, and a cathode electrode 270. One or more of these layers may be insulated from each other with an insulating layer if as they are not connected by an opening.

The substrate 100 may be formed of a flexible substrate 100 including plastic and a polyimide (PI).

A barrier layer 110 is formed on the substrate 100. The barrier layer 110 may be formed of an inorganic material.

The overlapped metal layer 112 is formed on the barrier layer 110. The overlapped metal layer 112 is formed in the display area that includes the pixels, and is formed on a same layer as the metal layer 111 formed in the non-display area. In an exemplary embodiment, the overlapped metal layer 112 may not be formed in the display area, and the metal layer 111 may be formed in the non-display area.

The buffer layer 120 is formed to cover the overlapped metal layer 112 and the barrier layer 110.

The semiconductor layers 130 and 131 are provided on the buffer layer 120. The semiconductor layers 130 and 131 may include polycrystalline silicon, an oxide semiconductor material, and amorphous silicon. For example, the gate insulating layer 130 may include a metal element such as indium (In), zinc (Zn), gallium (Ga), tin (Sn), or germanium (Ge), and an oxide of a material selected from among combinations thereof.

The first gate insulating layer 131 is formed to cover the semiconductor layer 130 and the substrate 100.

The first gate electrode layers 121, 122, and 123 are formed on the first gate insulating layer 131, and include a first gate electrode 121, a second gate electrode 122, and a third gate electrode 123.

The second gate insulating layer 132 is formed to cover the first gate electrode layers 121, 122, and 123 and the first gate insulating layer 131.

The second gate electrode layers 125 and 126 are formed on the second gate insulating layer 132 and include an overlapped gate electrode 125 and a storage electrode 126.

The third gate insulating layer 133 is formed to cover the second gate electrode layers 125 and 126 and the second gate insulating layer 132.

The first data electrode layers 165, 166, 147, and 146 are formed on the third gate insulating layer 133, and include a source electrode 165, a drain electrode 166, a gate connector 147, and a driving voltage connector 176.

The source electrode 165 and the drain electrode 166 are connected to the gate insulating layer 130 and form a thin film transistor with the first gate electrode 121.

The gate connector 147 is provided to overlap the third gate electrode 123 and may be electrically connected through an opening formed in the second gate insulating layer 132 and the third gate insulating layer 133.

The driving voltage connector 176 partially overlaps the storage electrode 126 and may be electrically connected thereto through an opening formed in the second gate insulating layer 132 and the third gate insulating layer 133.

The fourth gate insulating layer 134 is formed to cover the first data electrode layers 165, 166, 147, and 146 and the third gate insulating layer 133. In an exemplary embodiment, the first gate insulating layer 131, the second gate insulating layer 132, the third gate insulating layer 133, and the fourth gate insulating layer 134 may be together referred to as a gate insulating layer 130.

The interlayer insulating layer 160 is formed on the fourth gate insulating layer 134 and may be formed of an organic insulating layer.

The second data electrode layers 167 and 155 are formed on the interlayer insulating layer 160 and include an anode electrode connector 167 and a first voltage line 155.

The anode electrode connector 167 provides a driving current (Id) to the anode electrode 191. The anode electrode connector 167 partially overlaps the source electrode 165 of the thin film transistor, and is electrically connected to an opening through an interlayer insulating layer 160.

The first voltage line 155 is a wire for applying the driving voltage (ELVDD) and may partially overlap the driving voltage connector 176. The first voltage line 155 is electrically connected through an opening formed in the interlayer insulating layer 160.

The passivation layer 180 is formed to cover the second data electrode layers 167 and 155 and the interlayer insulating layer 160. The passivation layer 180 may be formed of an organic insulating layer.

The anode electrode 191 is formed on the passivation layer 180 and may be formed of a transparent conductive material or a reflective metal. The anode electrode 191 may be electrically connected to the anode electrode connector 167 through the opening formed in the passivation layer 180, and may be a pixel electrode of the OLED.

The upper organic layer 350 is formed to cover the anode electrode 191 and the passivation layer 180. The upper organic layer 350 may be formed of an organic material. The organic emission layer 370 is formed in an open portion of the upper organic layer 350. The organic emission layer 370 may include at least one of an emission layer, a hole injection layer (HIL), a hole transporting layer (HTL), an electron transporting layer (ETL), and an electron injection layer (EIL).

The cathode electrode 270 is formed on the upper organic layer 350 and the organic emission layer 370. The cathode electrode 270 may be formed of a transparent conductive material or a reflective metal. The cathode electrode 270 may be a common electrode of the OLED. The anode electrode 191, the organic emission layer 370, and the cathode electrode 270 configure the OLED.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. An organic light emitting diode display comprising:
   a substrate including a display area and a non-display area;
   a metal layer disposed on the non-display area of the substrate;
   a gate insulating layer covering the metal layer and the substrate, wherein the gate insulating layer made of an inorganic material;
   a first voltage line disposed on the gate insulating layer and receiving a driving voltage;
   a second voltage line disposed on the gate insulating layer and receiving a low driving voltage, wherein the low driving voltage is lower than the driving voltage;
   an organic insulating layer covering the first voltage line and the second voltage line; and
   a cathode electrode disposed on the organic insulating layer,
   wherein the second voltage line and the cathode electrode are electrically connected to each other through an opening formed in the organic insulating layer, and
   the first voltage line or the second voltage line is electrically connected to the metal layer through an opening formed in the gate insulating layer.

2. The organic light emitting diode display of claim 1, wherein
   the second voltage line is disposed to surround four sides of the display area.

3. The organic light emitting diode display of claim 2, wherein
   the first voltage line is disposed to partially overlap the second voltage line in the non-display area.

4. The organic light emitting diode display of claim 3, wherein
   the organic insulating layer includes:
   an interlayer insulating layer disposed to cover the first voltage line disposed on the gate insulating layer;
   a passivation layer disposed to cover the second voltage line disposed on the interlayer insulating layer; and
   an upper organic layer disposed on the passivation layer.

5. The organic light emitting diode display of claim 4, further comprising:
- a first voltage applying connector disposed on the gate insulating layer; and
- a first voltage applying wire disposed on the interlayer insulating layer,
- wherein the first voltage applying wire is electrically connected to the first voltage applying connector through an opening formed in the interlayer insulating layer, and
- the first voltage applying connector is electrically connected to the metal layer through an opening formed in the gate insulating layer.

6. The organic light emitting diode display of claim 5, wherein
- the first voltage line is electrically connected to the metal layer through an opening formed in the gate insulating layer.

7. The organic light emitting diode display of claim 4, further comprising:
- an anode electrode disposed between the passivation layer and the upper organic layer; and
- an organic emission layer disposed on the anode electrode,
- wherein the cathode electrode is disposed on the organic emission layer.

8. The organic light emitting diode display of claim 4, further comprising
- a cathode electrode connector disposed on the passivation layer,
- wherein the cathode electrode connector is electrically connected to the cathode electrode through an opening formed in the upper organic layer, and
- the cathode electrode connector is electrically connected to the second voltage line through an opening formed in the passivation layer.

9. The organic light emitting diode display of claim 8, further comprising
- a second voltage line connector disposed on the gate insulating layer,
- wherein the second voltage line connector is electrically connected to the second voltage line through an opening formed in the interlayer insulating layer.

10. The organic light emitting diode display of claim 1, wherein
- the second voltage line is disposed to surround at least three sides of the display area.

11. The organic light emitting diode display of claim 10, wherein
- the organic insulating layer includes:
- an interlayer insulating layer disposed to cover the first voltage line disposed on the gate insulating layer;
- a passivation layer disposed to cover the second voltage line disposed on the interlayer insulating layer; and
- an upper organic layer disposed on the passivation layer.

12. The organic light emitting diode display of claim 11, further comprising
- a first voltage line auxiliary connector disposed on the gate insulating layer,
- wherein the first voltage line is disposed on the interlayer insulating layer, and is electrically connected to the first voltage line auxiliary connector through an opening formed in the interlayer insulating layer.

13. The organic light emitting diode display of claim 11, further comprising
- a second voltage line connector disposed on the gate insulating layer,
- wherein the second voltage line connector is electrically connected to the metal layer through an opening formed in the gate insulating layer, and
- the second voltage line is electrically connected to the second voltage line connector through an opening formed in the interlayer insulating layer.

14. The organic light emitting diode display of claim 11, further comprising
- a cathode electrode connector disposed on the passivation layer,
- wherein the cathode electrode connector is electrically connected to the cathode electrode through an opening formed in the upper organic layer, and
- the cathode electrode connector is electrically connected to the second voltage line through an opening formed in the passivation layer.

15. The organic light emitting diode display of claim 11, further comprising:
- a second voltage applying connector disposed on the gate insulating layer; and
- a second voltage applying wire disposed on the interlayer insulating layer,
- wherein the second voltage applying wire is electrically connected to the second voltage applying connector through an opening formed in the interlayer insulating layer, and
- the second voltage applying connector is electrically connected to the metal layer through an opening formed in the gate insulating layer.

16. The organic light emitting diode display of claim 1, wherein
- the second voltage line is disposed to surround three sides of the display area.

17. An organic light emitting diode display comprising:
- a substrate including a display area and a non-display area;
- a gate insulating layer disposed on the substrate;
- a first voltage line disposed on the gate insulating layer and receiving a driving voltage;
- an inorganic insulating layer covering the first voltage line and the gate insulating layer;
- an interlayer insulating layer disposed on the inorganic insulating layer;
- a second voltage line disposed on the interlayer insulating layer and receiving a low driving voltage, wherein the low driving voltage is lower than the driving voltage;
- an organic insulating layer disposed on the second voltage line; and
- a cathode electrode disposed on the organic insulating layer,
- wherein the second voltage line and the cathode electrode are electrically connected to each other through an opening formed in the organic insulating layer, and
- the first voltage line and the second voltage line are disposed to partially overlap each other at a lower portion of the non-display area in a plan view.

18. The organic light emitting diode display of claim 17, wherein
- the second voltage line is disposed to surround four sides of the display area.

19. The organic light emitting diode display of claim 17, wherein
- the organic insulating layer includes:
- a passivation layer disposed to cover the second voltage line disposed on the interlayer insulating layer; and
- an upper organic layer disposed on the passivation layer.

20. The organic light emitting diode display of claim 19, further comprising:
   an anode electrode disposed between the passivation layer and the upper organic layer; and
   an organic emission layer disposed on the anode electrode,
   wherein the cathode electrode is disposed on the organic emission layer.

* * * * *